(12) United States Patent
Kinsley

(10) Patent No.: US 10,090,282 B1
(45) Date of Patent: Oct. 2, 2018

(54) SEMICONDUCTOR DEVICE ASSEMBLIES WITH LIDS INCLUDING CIRCUIT ELEMENTS

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/621,955

(22) Filed: Jun. 13, 2017

(51) Int. Cl.
*H01L 33/48* (2010.01)
*H01L 25/065* (2006.01)

(52) U.S. Cl.
CPC ...... *H01L 25/0657* (2013.01); *H01L 2225/06548* (2013.01); *H01L 2225/06582* (2013.01); *H01L 2225/06589* (2013.01)

(58) Field of Classification Search
CPC ............. H01L 24/0657; H01L 25/0657; H01L 25/0652; H01L 25/04; H01L 23/3114; H01L 23/053; H01L 23/49805; H01L 33/48
USPC ........................................................ 257/690
See application file for complete search history.

(56) References Cited

U.S. PATENT DOCUMENTS

| | | | | |
|---|---|---|---|---|
| 6,376,769 | B1* | 4/2002 | Chung | B32B 3/08 174/260 |
| 8,618,619 | B1 | 12/2013 | Miks et al. | |
| 2009/0014827 | A1* | 1/2009 | Lim | H01L 27/14618 257/434 |
| 2010/0019377 | A1 | 1/2010 | Arvelo et al. | |
| 2012/0211867 | A1 | 8/2012 | Seroff et al. | |
| 2013/0119528 | A1 | 5/2013 | Groothuis et al. | |
| 2014/0084445 | A1* | 3/2014 | Lin | H01L 23/3677 257/698 |
| 2015/0200175 | A1* | 7/2015 | Hatori | H01L 24/16 257/737 |
| 2015/0279828 | A1 | 10/2015 | Koopmans et al. | |

(Continued)

FOREIGN PATENT DOCUMENTS

JP 2010245384 A 10/2010
KR 20110037066 4/2011

OTHER PUBLICATIONS

Koyanagi, Mitsumasa. "The Stacked Capacitor DRAM Cell and Three-Dimensional Memory", IEEE SSCS News, Winter 2008, pp. 37-41.

(Continued)

*Primary Examiner* — Chuong A Luu
(74) *Attorney, Agent, or Firm* — Perkins Coie LLP

(57) ABSTRACT

A semiconductor device package is provided. The semiconductor device package includes a stack of semiconductor dies over a substrate, the substrate including a plurality of electrical contacts, and an annular lower lid disposed over the substrate and surrounding the stack of semiconductor dies. The annular lower lid includes a lower surface coupled to the substrate, an upper surface coupled to an upper lid, and an outer surface in which is formed an opening. The semiconductor device assembly further includes a circuit element disposed in the opening and electrically coupled to at least a first one of the plurality of electrical contacts. The semiconductor device assembly further includes the upper lid disposed over the annular lower lid and the stack of semiconductor dies.

18 Claims, 4 Drawing Sheets

(56) References Cited

U.S. PATENT DOCUMENTS

| | | |
|---|---|---|
| 2015/0333019 A1 | 11/2015 | Lee et al. |
| 2016/0148919 A1* | 5/2016 | Nishimura .............. H01L 23/24 257/659 |
| 2016/0181125 A1 | 6/2016 | Li et al. |
| 2016/0254236 A1* | 9/2016 | Kim .................... H01L 23/3114 257/659 |
| 2016/0343687 A1 | 11/2016 | Vadhavkar et al. |

OTHER PUBLICATIONS

U.S. Appl. No. 15/442,392—Unpublished Patent Application by Thomas H. Kinsley, titled "Semiconductor Device Assemblies With Electrically Functional Heat Transfer Structures", filed Feb. 24, 2017, 25 pages.

U.S. Appl. No. 15/621,939—Unpublished Patent Application by Thomas H. Kinsley, titled "Semiconductor Device Assemblies With Annular Interposers", filed Jun. 13, 2017, 26 pages.

International Application No. PCT/US2018/015661—PCT International Search Report and Written Opinion, dated Jun. 26, 2018, 15 pages.

* cited by examiner

SEMICONDUCTOR DEVICE ASSEMBLIES WITH LIDS INCLUDING CIRCUIT ELEMENTS

CROSS-REFERENCE TO RELATED APPLICATION(S)

This application contains subject matter related to a U.S. Patent Application by Thomas H. Kinsley, entitled "SEMICONDUCTOR DEVICE ASSEMBLIES WITH ELECTRICALLY FUNCTIONAL HEAT TRANSFER STRUCTURES." The related application, of which the disclosure is incorporated by reference herein, is assigned to Micron Technology, Inc., and was filed on Feb. 24, 2017 with U.S. application Ser. No. 15/442,392.

This application contains subject matter related to a concurrently-filed U.S. patent application Ser. No. 15/621,939 by Thomas H. Kinsley, entitled "SEMICONDUCTOR DEVICE ASSEMBLIES WITH ANNULAR INTERPOSERS." The related application, of which the disclosure is incorporated by reference herein, is assigned to Micron Technology, Inc.

TECHNICAL FIELD

The present disclosure generally relates to semiconductor devices, and more particularly relates to semiconductor devices having lids including circuit elements.

BACKGROUND

Packaged semiconductor dies, including memory chips, microprocessor chips, and imager chips, typically include a semiconductor die mounted on a substrate and encased in a plastic protective covering or covered by a heat-conducting lid. The die includes functional features, such as memory cells, processor circuits, and/or imager devices, as well as bond pads electrically connected to the functional features. The bond pads can be electrically connected to terminals outside the protective covering to allow the die to be connected to higher level circuitry.

Semiconductor manufacturers continually reduce the size of die packages to fit within the space constraints of electronic devices, while also increasing the functional capacity of each package to meet operating parameters. One approach for increasing the functional capacity of a semiconductor package without substantially increasing the surface area covered thereby (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs).

In vertically stacked packages the heat generated by the numerous dies in a small area, together with the height of the die stack, can make thermal management challenging. One approach to thermal management for semiconductor packages with heat-generating die stacks has been to provide a thermally conductive lid attached to both the die stack (for better thermal conduction) and the substrate (for better mechanical stability and die protection). Such lids can either be one-part lids (e.g., with a recess provided for the die stack) or two-part lids (with an annular lower lid surrounding the die stack and connecting a planar upper lid to the substrate). Annular lower lids can be expensive to fabricate, and contribute little to the thermal management of the package device (e.g., as most heat is generated in the die stack and conducted vertically to the upper lid). Nevertheless, annular lower lids account for a significant portion of the total volume of the semiconductor package. Accordingly, there is a need for semiconductor packages with better thermal management solutions and more efficient use of space.

DETAILED DESCRIPTION

Figure 1:
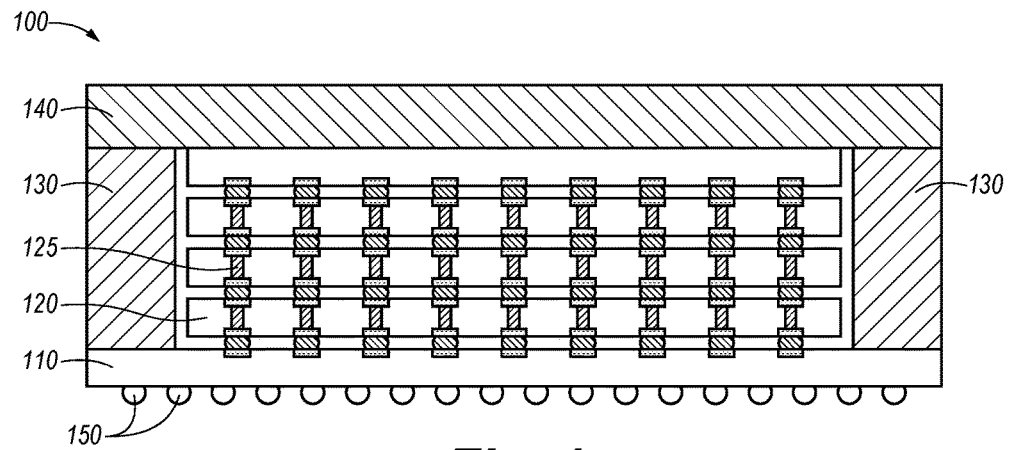
FIG. 1 is a simplified cross-sectional view of a semiconductor device assembly including a two-piece lid.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for better thermal management solutions and more efficient use of space. Accordingly, several embodiments of semiconductor devices in accordance with the present technology can provide semiconductor device packages with lids having circuit elements therein.

Several embodiments of the present technology are directed to semiconductor devices comprising lids having circuit elements therein. In one embodiment, a semiconductor device package includes a stack of semiconductor dies over a substrate, the substrate including a plurality of electrical contacts, and an annular lower lid disposed over the substrate and surrounding the stack of semiconductor dies. The annular lower lid includes a lower surface coupled to the substrate, an upper surface coupled to an upper lid, and an outer surface in which is formed an opening. The semiconductor device assembly further includes a circuit element disposed in the opening and electrically coupled to at least a first one of the plurality of electrical contacts. The semiconductor device assembly further includes the upper lid disposed over the annular lower lid and the stack of semiconductor dies.

Specific details of several embodiments of semiconductor device assemblies having annular interposers are described below. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device or device assembly in view of the orientation shown in the Figures. For example, "upper" or "uppermost" can refer to a feature positioned closer to or closest to, respectively, the top of a page than another feature or portion of the same feature. These terms, however, should be construed broadly to include semiconductor devices having other orientations, such as inverted or inclined orientations where top/bottom, over/under, above/below, up/down, and left/right can be interchanged depending on the orientation.

FIG. 1 is a simplified cross-sectional view of a semiconductor device assembly including a conventional two-piece lid. The semiconductor device assembly 100 includes a stack of semiconductor dies 120 disposed over a medial region of the upper surface of a package substrate 110. The stack of semiconductor dies 120 can be connected to one another and to the package substrate 110 by a plurality of through-silicon vias (TSVs) 125. The semiconductor device assembly 100 further includes a plurality of package contacts, such as solder balls 150, that provide electrical connectivity to the stack of semiconductor dies 120. The semiconductor device assembly 100 further includes an annular lower lid 130 disposed over the package substrate 110 and surrounding the stack of semiconductor dies 120. The annular lower lid 130 has an upper surface approximately coplanar with an upper surface of the uppermost one of the stack of semiconductor dies 120. The semiconductor device assembly 100 further includes an upper lid 140 disposed over the stack of semiconductor dies 120 and the annular lower lid 130.

The majority of the heat generated in the semiconductor device assembly 100 is generated by the stack of semiconductor dies 120 and conducted vertically to the upper lid 140. Accordingly, the lower lid 130 in the conventional design of semiconductor device assembly 100 does not provide significant thermal management benefits. Accordingly, embodiments of the present disclosure provide lids in which circuit elements can be disposed and electrically coupled to the semiconductor device assembly's package substrate.

Figure 2:
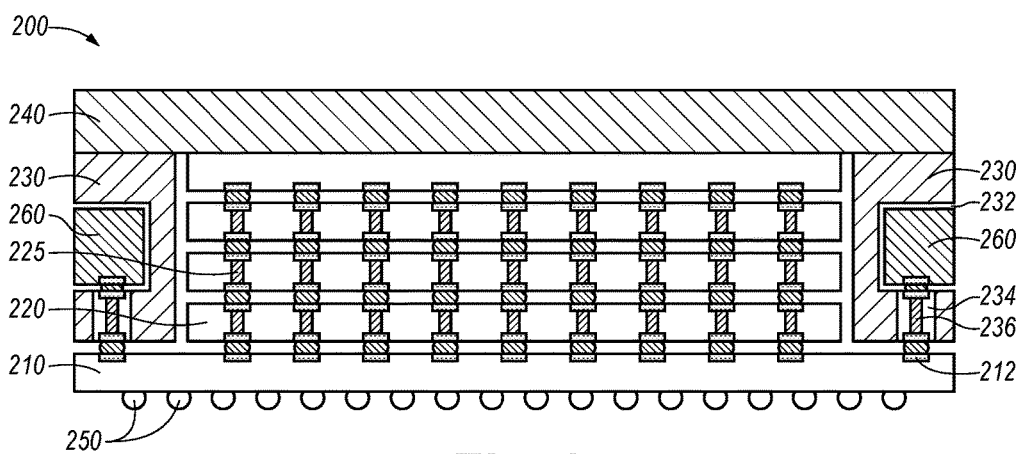
FIG. 2 is a simplified cross-sectional view of a semiconductor device assembly including a lid having circuit elements therein in accordance with an embodiment of the present technology.

For example, FIG. 2 is a simplified cross-sectional view of a semiconductor device assembly including a two-part lid having circuit elements therein in accordance with an embodiment of the present technology. The semiconductor device assembly 200 includes a stack of semiconductor dies 220 disposed over a medial region of the upper surface of a package substrate 210. The stack of semiconductor dies 220 can be connected to one another and to the package substrate 210 by a plurality of through-silicon vias (TSVs) 225. The semiconductor device assembly 200 further includes a plurality of package contacts, such as solder balls 250, that provide electrical connectivity to the stack of semiconductor dies 220. The semiconductor device assembly 200 further includes an annular lower lid 230 disposed over the package substrate 210 and surrounding the stack of semiconductor dies 220. The annular lower lid 230 can be made of any one of a number of materials, including a thermally conductive metal such as copper, aluminum or the like. A height of the annular lower lid 230 can be selected based on the height of the stack of semiconductor dies 220 (e.g., so that an upper surface of the annular lower lid 230 can be approximately coplanar with an upper surface of the uppermost one of the stack of semiconductor dies 220). The semiconductor device assembly 200 further includes an upper lid 240 disposed over the stack of semiconductor dies 220 and the annular lower lid 230.

In accordance with one embodiment of the present technology, the annular lower lid 230 can include one or more openings in an outer surface thereof, such as opening 232. One or more circuit elements such as circuit element 260 can be disposed within the opening 232, and can be electrically coupled by a via 236 to one or more electrical contacts 212 on the package substrate 210. The via 236 can be insulated from the lower lid 230 by an insulating material 234. The circuit element 260 can be any one of a number of circuit elements, including circuit elements that can particularly benefit from access to the environment exterior to semiconductor device assembly 200. For example, in one embodiment of the present technology, the circuit element 260 can be an antenna or an optical element (e.g., laser, light-emitting diode, infrared emitter) configured for wireless communication. In another embodiment, circuit element 260 can be any one of a number of environmental sensors (e.g., for sensing ambient light, or pressure, or temperature, or humidity, etc.).

Although in the example illustrated in FIG. 2, a single circuit element 260 is disposed in opening 232, those skilled in the art will readily understand that multiple circuit elements can be disposed in a single opening. Moreover, while an opening is illustrated in each opposing side of the outer surface of the semiconductor device assembly 200 in the cross-sectional view of FIG. 2, in other embodiments a semiconductor device assembly can include any number of openings having one or more circuit elements disposed therein, including a single opening on a single side, or more than one opening on multiple sides, or some combination thereof.

Figure 3:
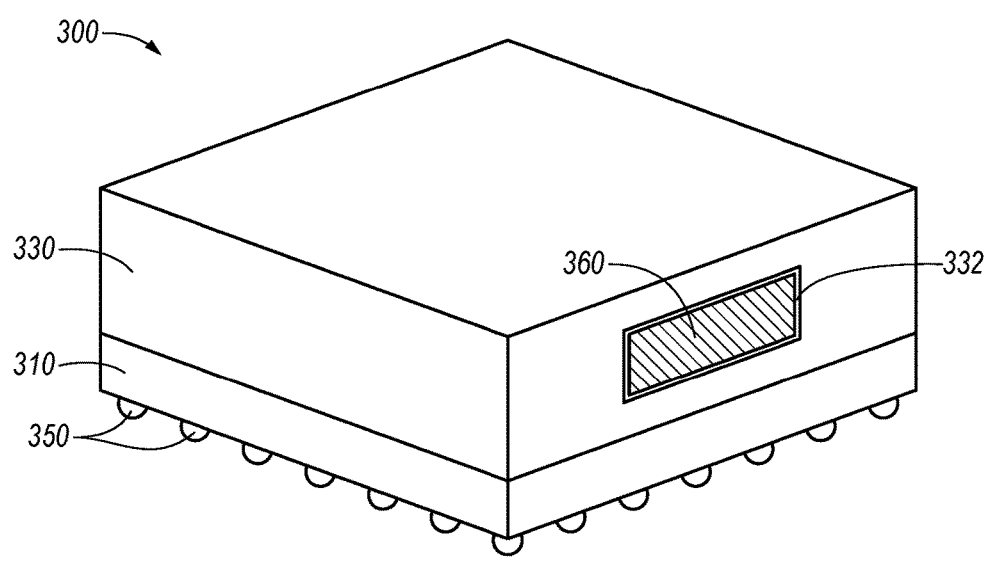
FIG. 3 is a simplified perspective view of a semiconductor device assembly including a lid having circuit elements therein in accordance with an embodiment of the present technology.

Although in the foregoing example embodiment, the semiconductor device assembly 200 has been illustrated with a two-piece lid, in other embodiments, a semiconductor device assembly can have a one-piece lid including one or more openings in which one or more circuit elements are disposed. For example, FIG. 3 is a simplified perspective view of a semiconductor device assembly including a one-piece lid having circuit elements therein in accordance with an embodiment of the present technology. The semiconductor device assembly 300 includes a stack of semiconductor dies (not illustrated) disposed over a medial region of the upper surface of a package substrate 310. The semiconductor device assembly 300 further includes a plurality of package contacts, such as solder balls 350, that provide electrical connectivity to the stack of semiconductor dies. The semiconductor device assembly 300 further includes a one-piece lid 330 disposed over the package substrate 310 and surrounding the stack of semiconductor dies.

In accordance with one embodiment of the present technology, the one-piece lid 330 can include one or more openings in an outer surface thereof, such as opening 332. One or more circuit elements such as circuit element 360 can be disposed within the opening 332, and can be electrically coupled to one or more electrical contacts on the package substrate 310. The circuit element 360 can be any one of a number of circuit elements, including circuit elements that can particularly benefit from access to the environment exterior to semiconductor device assembly 300. For example, in one embodiment of the present technology, the circuit element 360 can be an antenna or an optical element (e.g., laser, light-emitting diode, infrared emitter) configured for wireless communication.

Figure 4:
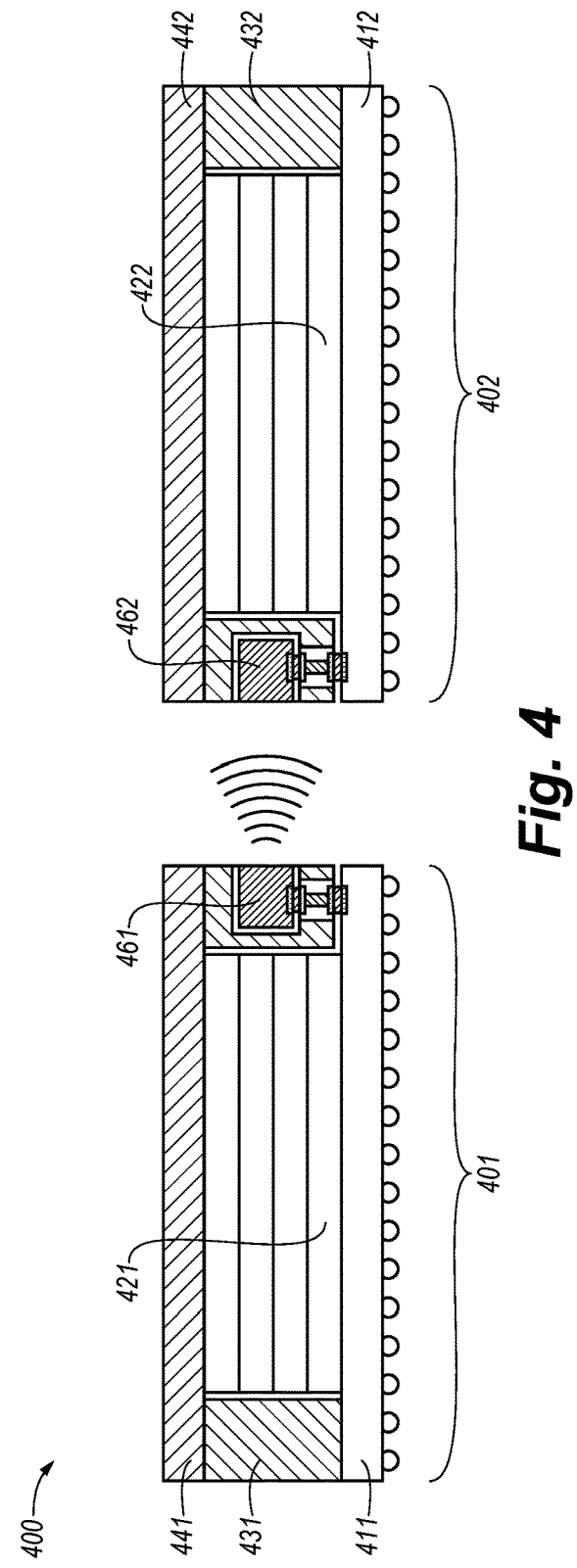
FIG. 4 is a simplified cross-sectional view of a system including semiconductor device assemblies with lids having circuit elements therein in accordance with an embodiment of the present technology.

In accordance with one aspect of the subject technology, disposing one or more circuit elements in one or more openings in an outer surface of a semiconductor device assembly's lid can facilitate wireless communication between the circuit element(s) and other devices. In this regard, FIG. 4 is a simplified cross-sectional view of a system including semiconductor device assemblies with lids having circuit elements therein in accordance with an embodiment of the present technology. The system 400 includes a first semiconductor device assembly 401 in wireless communication with a second semiconductor device assembly 402. The first semiconductor device assembly 401 includes a first stack of semiconductor dies 421 disposed over a first package substrate 411, a first annular lower lid 431 disposed over the first package substrate 411 and surrounding the first stack of semiconductor dies 421 and a first upper lid 441 disposed over the first stack of semiconductor dies 421 and the first annular lower lid 431. The second semiconductor device assembly 402 similarly includes a second stack of semiconductor dies 422 disposed over a second package substrate 412, a second annular lower lid 432 disposed over the second package substrate 412 and surrounding the second stack of semiconductor dies 422 and a second upper lid 442 disposed over the second stack of semiconductor dies 422 and the second annular lower lid 432. Each of the first and second annular lower lids 431 and 432 include an opening in an outer surface thereof, in which is disposed respective first and second circuit elements 461 and 462. The first and second circuit elements 461 and 462 are electrically coupled to electrical contacts on the respective first and second package substrates 411 and 412. The first and second circuit elements 461 and 462 can be antennas or other elements (e.g., optical elements such as lasers, light-emitting diodes, infrared emitters, etc.) configured to wirelessly communicate with one another. By disposing the first and second circuit elements 461 and 462 in openings in outer surfaces of the lids of their respective semiconductor device assemblies 401 and 402, wireless communication can be facilitated at greater ranges than would be possible with circuit elements either enclosed within the lids or requiring a line of sight.

Figure 5:
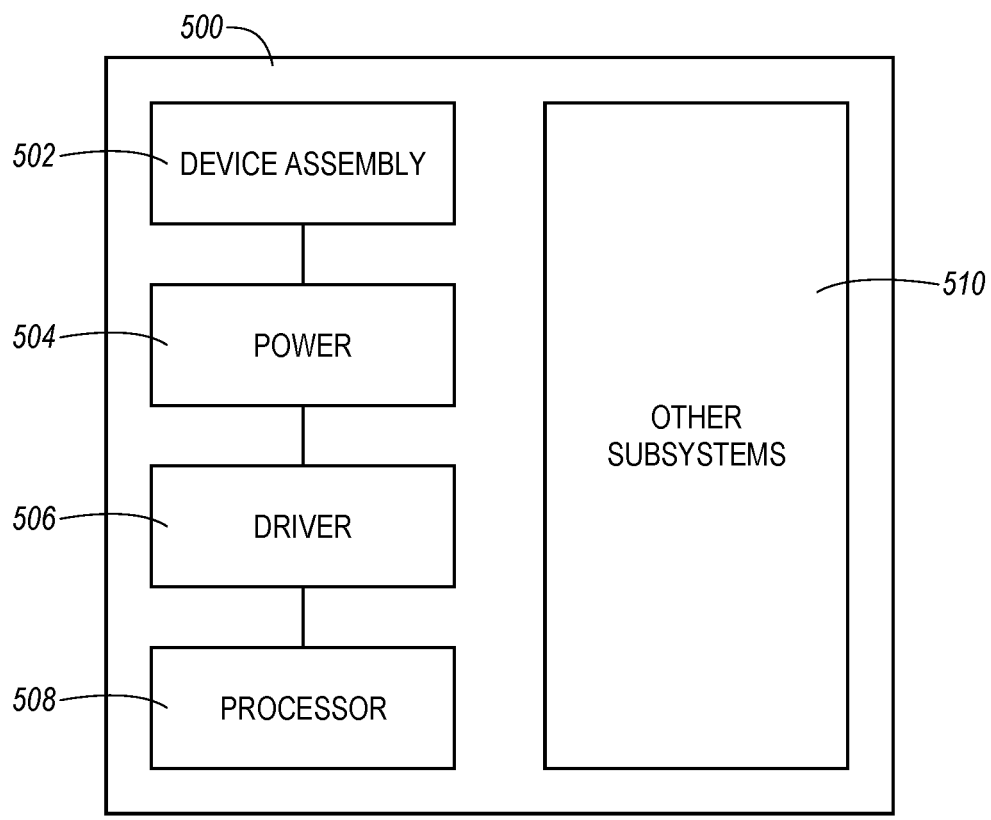
FIG. 5 is a schematic view showing a system that includes a semiconductor device assembly with lids having circuit elements therein configured in accordance with an embodiment of the present technology.

Although in the foregoing examples, semiconductor device assemblies have been illustrated with a stack of semiconductor dies over a package substrate, in other embodiments of the present technology, a semiconductor device assembly may have a single die or multiple dies in arrangements other than a vertical stack. Moreover, any one of the stacked semiconductor device assemblies described above with reference to FIGS. 2-4 can be incorporated into any of a myriad of larger and/or more complex systems, a representative example of which is system 500 shown schematically in FIG. 5. The system 500 can include a semiconductor device assembly 502, a power source 504, a driver 506, a processor 508, and/or other subsystems or components 510. The semiconductor device assembly 502 can include features generally similar to those of the semiconductor device assemblies described above with reference to FIGS. 2-4, and can therefore include one or more annular interposers. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, vehicles, appliances and other products. Components of the system 500 may be housed in a single unit or distributed over multiple, interconnected units (e.g., through a communications network). The components of the system 500 can also include remote devices and any of a wide variety of computer readable media.

From the foregoing, it will be appreciated that specific embodiments of the invention have been described herein for purposes of illustration, but that various modifications may be made without deviating from the scope of the invention. Accordingly, the invention is not limited except as by the appended claims.

I claim:

1. A semiconductor device package, comprising:
a stack of semiconductor dies over a substrate;
the substrate including a plurality of electrical contacts;
an annular lower lid disposed over the substrate and surrounding the stack of semiconductor dies, the annular lower lid including a lower surface coupled to the substrate, an upper surface coupled to an upper lid, and an outer surface in which is formed an opening;
a circuit element disposed in the opening and electrically coupled to at least a first one of the plurality of electrical contacts; and
the upper lid disposed over the annular lower lid and the stack of semiconductor dies,
wherein the opening is a first opening and the circuit element is a first circuit element, and wherein the annular lower lid includes a second opening in the outer surface, and wherein the semiconductor device package includes a second circuit element disposed in the second opening and electrically coupled to at least a second one of the plurality of electrical contacts.

2. The semiconductor device package of claim 1, wherein the lower lid comprises a metal.

3. The semiconductor device package of claim 1, wherein the upper lid comprises a metal.

4. The semiconductor device package of claim 1, wherein the first circuit element is configured for wireless communication.

5. The semiconductor device package of claim 1, wherein the first circuit element is a sensor.

6. The semiconductor device package of claim 1, wherein the semiconductor device package includes a third circuit element disposed in the first opening and electrically coupled to at least a third one of the plurality of electrical contacts.

7. The semiconductor device package of claim 1, wherein the lower lid includes at least one via electrically coupling the first circuit element to the first one of the plurality of electrical contacts.

8. The semiconductor device package of claim 7, wherein the at least one via is electrically isolated from the lower lid.

9. The semiconductor device package of claim 7, wherein the at least one via is electrically coupled to the first one of the plurality of electrical contacts by a solder joint.

10. A semiconductor device package, comprising:
- a stack of semiconductor dies over a substrate;
- the substrate including a plurality of electrical contacts;
- a lid disposed over the substrate and surrounding the die stack, the lid including a lower surface coupled to the substrate, an upper surface above the stack of semiconductor dies, and an outer surface in which is formed an opening; and
- a circuit element disposed in the opening and electrically coupled to at least a first one of the plurality of electrical contacts,
- wherein the opening is a first opening and the circuit element is a first circuit element, and wherein the lid includes a second opening in the outer surface, and wherein the semiconductor device package includes a second circuit element disposed in the second opening and electrically coupled to at least a second one of the plurality of electrical contacts.

11. The semiconductor device package of claim 10, wherein the lid comprises a metal.

12. The semiconductor device package of claim 10, wherein the first circuit element is configured for wireless communication.

13. The semiconductor device package of claim 10, wherein the first circuit element is a sensor.

14. The semiconductor device package of claim 10, wherein the semiconductor device package includes a third circuit element disposed in the first opening and electrically coupled to at least a third one of the plurality of electrical contacts.

15. The semiconductor device package of claim 10, wherein the lid includes at least one via electrically coupling the first circuit element to the first one of the plurality of electrical contacts.

16. The semiconductor device package of claim 15, wherein the at least one via is electrically isolated from the lid.

17. The semiconductor device package of claim 15, wherein the at least one via is electrically coupled to the first one of the plurality of electrical contacts by a solder joint.

18. The semiconductor device package of claim 10, wherein the lid is a two-piece lid comprising an annular lower lid and an upper lid.

\* \* \* \* \*